United States Patent
Fugate et al.

(10) Patent No.: US 6,525,594 B2
(45) Date of Patent: Feb. 25, 2003

(54) ELIMINATING POWER-DOWN POPPING IN AUDIO POWER AMPLIFIERS

(75) Inventors: Kevin R. Fugate, Madison, MS (US); Kenneth L. Arcudia, Ridgeland, MS (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/932,318

(22) Filed: Aug. 17, 2001

(65) Prior Publication Data

US 2002/0021164 A1 Feb. 21, 2002

Related U.S. Application Data

(60) Provisional application No. 60/226,785, filed on Aug. 21, 2000.

(51) Int. Cl.[7] .................................................. H03K 3/01

(52) U.S. Cl. ........................................................ 327/534
(58) Field of Search ................................ 327/530, 534, 327/535, 537, 538, 540, 541, 543

(56) References Cited

U.S. PATENT DOCUMENTS 6,111,455 A * 8/2000 Eleyan et al. ................ 327/534
6,333,571 B1 * 12/2001 Teraoka et al. .............. 307/115

* cited by examiner

*Primary Examiner*—Jeffrey Zweizig
(74) *Attorney, Agent, or Firm*—Alan K. Stewart; W. James Brady, III; Frederick J. Telecky, Jr.

(57) ABSTRACT

The circuit includes: a transistor 22; and a switch 32 coupled to a backgate of the transistor 22 for switching between a power supply node and current-path node of the transistor 22 to prevent a voltage on the backgate from dropping below the voltage on the current-path node.

16 Claims, 1 Drawing Sheet

ELIMINATING POWER-DOWN POPPING IN AUDIO POWER AMPLIFIERS

This application claims priority under 35 USC § 119 (e)(1) of provisional application No. 60/226,785 filed Aug. 21, 2000.

FIELD OF THE INVENTION

This invention generally relates to electronic systems, and more particularly it relates to audio power amplifiers.

BACKGROUND OF THE INVENTION

A prior art audio power amplifier with PMOS output driver is shown in FIG. 1. The device of FIG. 1 includes amplifier 20, PMOS output driver 22, NMOS output driver 24, output coupling capacitor 26, and resistance 28 which represents a speaker. The backgate diode node 30 of PMOS output driver 22 is connected directly to the supply voltage Vdd. During normal operation, supply voltage Vdd is greater than output voltage Vo. Thus the backgate diode of transistor 22 is normally reverse biased. However, during power down, output voltage Vo can exceed supply voltage Vdd due to the charge stored on capacitor 26. The backgate diode of transistor 22 then becomes forward biased. This can cause the output coupling capacitor 26 to rapidly discharge, creating an audible pop sound at the speaker 28.

SUMMARY OF THE INVENTION

Generally, and in one form of the invention, a circuit includes: a transistor; and a switch coupled to a backgate of the transistor for switching between a power supply node and current-path node of the transistor to prevent a voltage on the backgate from dropping below the voltage on the current-path node.

DETAILED DESCRIPTION OF PREFERRED EMBODIMENTS

Figure 1:
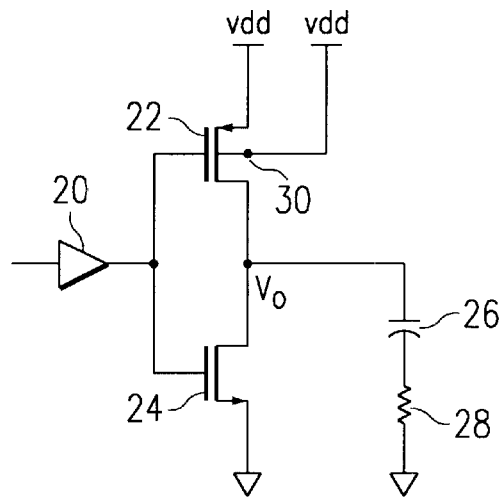
FIG. 1 is a prior art audio power amplifier circuit.
Figure 2:
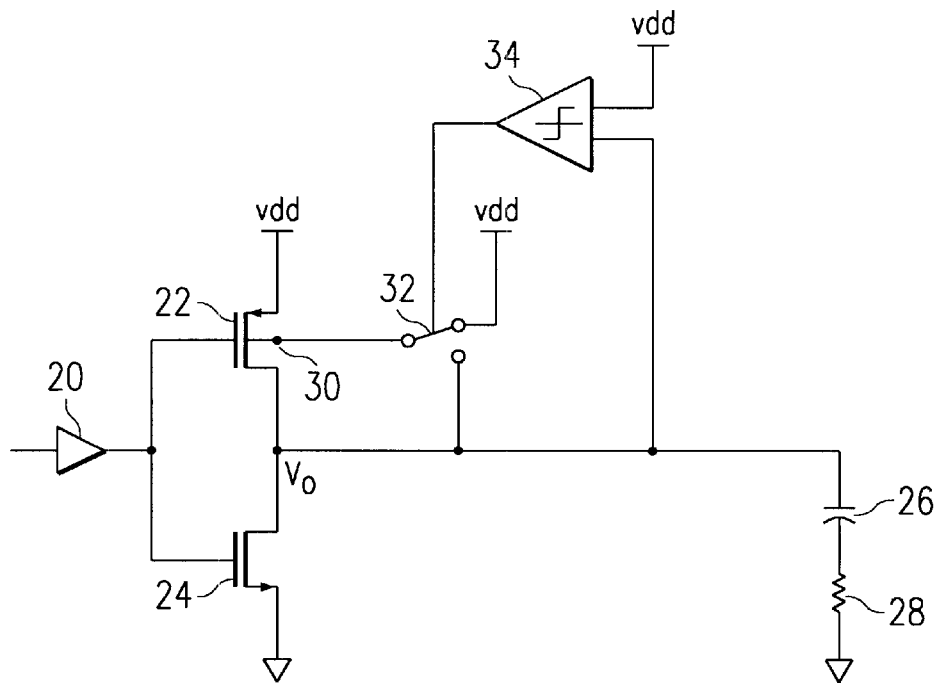
FIG. 2 is a preferred embodiment audio power amplifier circuit.

A preferred embodiment audio power amplifier circuit is shown in FIG. 2. The device of FIG. 2 includes all the components of the prior art device of FIG. 1 with the addition of switch 32 and switch control comparator 34. The backgate of PMOS output driver 22 is switched from supply voltage Vdd to output voltage Vo when output voltage Vo exceeds Vdd. When voltage Vo is below supply voltage Vdd, the backgate of driver 22 is switched to supply voltage Vdd. The switch 32 is controlled by comparator 34. Comparator 34 detects when supply voltage Vdd falls below output voltage Vo.

One advantage of the preferred embodiment is that it provides popless rapid power downs with slow and fast falling power supplies. Another advantage is that no additional circuitry is required to discharge the output coupling capacitor during the power down process.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
   a transistor;
   a switch coupled to a backgate of the transistor for switching between a power supply node and current-path node of the transistor to prevent a voltage on the backgate from dropping below the voltage on the current-path node; and
   a comparator for controlling the switch, the comparator having a first input coupled to the current-path node and a second input coupled to the power supply node.

2. The circuit of claim 1 wherein the transistor is a MOS transistor.

3. The circuit of claim 1 wherein the transistor is a PMOS transistor.

4. The circuit of claim 1 further comprising an amplifier coupled to a control node of the transistor.

5. The circuit of claim 1 further comprising another transistor coupled to the current-path node of the transistor.

6. The circuit of claim 5 further comprising an amplifier coupled to a control node of the transistor and to a control node of the other transistor.

7. The circuit of claim 1 further comprising a capacitor coupled to the current-path node of the transistor.

8. The circuit of claim 7 further comprising a resistance coupled to the capacitor.

9. The circuit of claim 8 wherein the resistance is a speaker.

10. The circuit of claim 6 further comprising a capacitor coupled to the current-path node of the transistor.

11. The circuit of claim 10 further comprising a resistance coupled to the capacitor.

12. The circuit of claim 11 wherein the resistance is a speaker.

13. A circuit comprising:
    an amplifier;
    a first transistor coupled to an output node and having a control node coupled to an output of the amplifier;
    a second transistor coupled to the output node and having a control node coupled to the output of the amplifier;
    a switch coupled to a backgate of the first transistor for switching between the output node and a voltage supply node; and
    a comparator for controlling the switch, the comparator having a first input coupled to the output node and a second input coupled to the voltage supply node.

14. The circuit of claim 13 further comprising a capacitor coupled to the output node.

15. The circuit of claim 14 further comprising a resistance coupled to the capacitor.

16. The circuit of claim 15 wherein the resistance is a speaker.

* * * * *